(12) United States Patent
Morita et al.

(10) Patent No.: US 7,728,359 B2
(45) Date of Patent: Jun. 1, 2010

(54) NITRIDE SEMICONDUCTOR BASED BIPOLAR TRANSISTOR AND THE METHOD OF MANUFACTURE THEREOF

(75) Inventors: Tatsuo Morita, Osaka (JP); Tetsuzo Ueda, Osaka (JP)

(73) Assignee: Panasonic Corporation, Osaka (JP)

( * ) Notice: Subject to any disclaimer, the term of this patent is extended or adjusted under 35 U.S.C. 154(b) by 299 days.

(21) Appl. No.: 11/812,591

(22) Filed: Jun. 20, 2007

(65) Prior Publication Data

US 2008/0121938 A1 May 29, 2008

(30) Foreign Application Priority Data

Jun. 23, 2006 (JP) .............................. 2006-173223

(51) Int. Cl.
*H01L 51/00* (2006.01)

(52) U.S. Cl. .................. 257/198; 257/76; 257/E51.016

(58) Field of Classification Search ................. 257/565, 257/47, 197, 542, 198; 438/48, 235
See application file for complete search history.

(56) References Cited

U.S. PATENT DOCUMENTS

| | | | |
|---|---|---|---|
| 5,920,231 A * | 7/1999 | Ando | 330/61 R |
| 6,441,391 B1 * | 8/2002 | Ohno et al. | 257/11 |
| 6,545,340 B1 * | 4/2003 | Higgs et al. | 257/565 |
| 2002/0132444 A1 * | 9/2002 | Yanagihara et al. | 438/412 |
| 2003/0064538 A1 * | 4/2003 | Fujimoto | 438/48 |
| 2003/0179793 A1 * | 9/2003 | Akasaka et al. | 372/45 |
| 2004/0175895 A1 * | 9/2004 | Behammer | 438/319 |

OTHER PUBLICATIONS

Murata, T. et al, "Source Resistance Reduction of AlGaN-GaN HFETs with Novel Superlattice Cap Layer," IEEE Transactions on Electron Devices, vol. 52, No. 6, 2005, pp. 1042-1047.
Makimoto, T. et al, "High Current Gains Obtained by InGaN/GaN Double Heterojunction Bipolar Transistors with p-InGaN Base," Applied Physics Letters, vol. 79, No. 3, Jul. 16, 2001, pp. 380-381.

* cited by examiner

*Primary Examiner*—Jerome Jackson, Jr.
*Assistant Examiner*—Dale Page
(74) *Attorney, Agent, or Firm*—Steptoe & Johnson LLP

(57) ABSTRACT

In a nitride semiconductor based bipolar transistor, a contact layer formed so as to contact an emitter layer is composed of n-type InAlGaN quaternary mixed crystals, the emitter layer and the contact layer are selectively removed so that the barrier height with the emitter formed thereon is small, and the ohmic electrode contact resistance can be lowered on the InAlGaN quaternary mixed crystals, for example, so that a WSi emitter electrode becomes an eave. A base electrode is formed by a self-aligned process using the emitter electrode as a mask. By such a configuration, the distance between the emitter and the edge of the base electrode is sufficiently shortened, and the base resistance can be lowered. As a result, a bipolar transistor having favorable high-frequency characteristics can be realized.

15 Claims, 5 Drawing Sheets

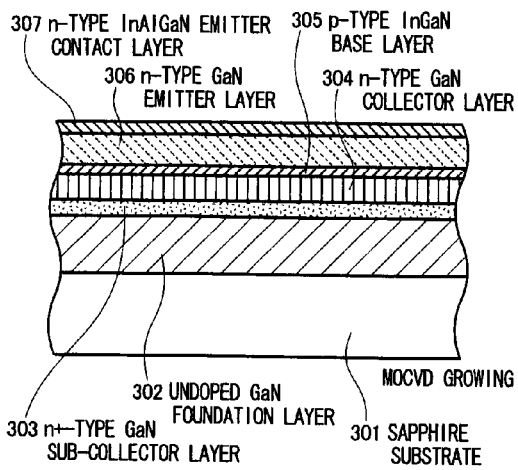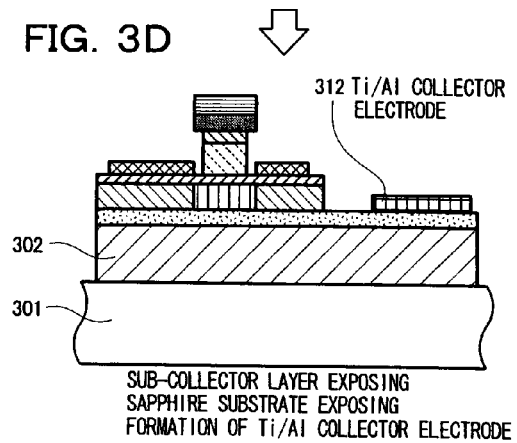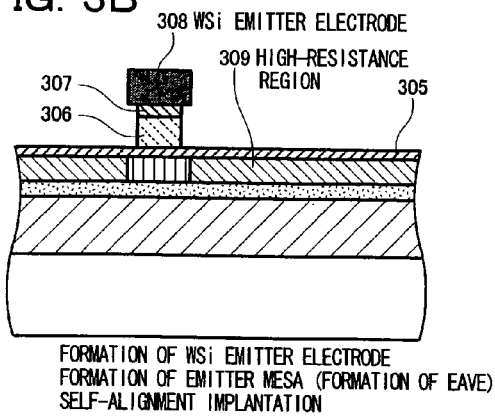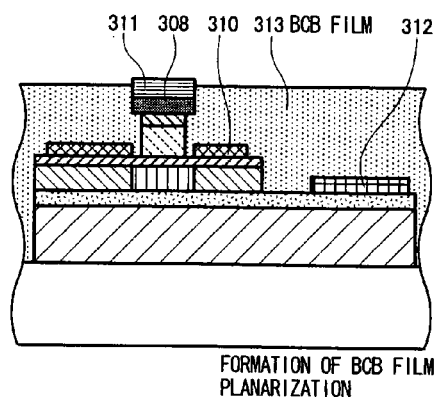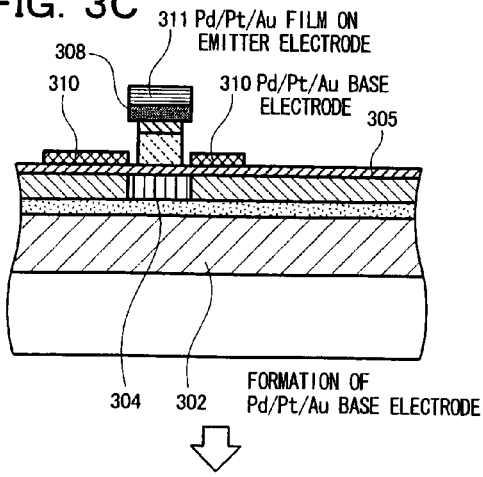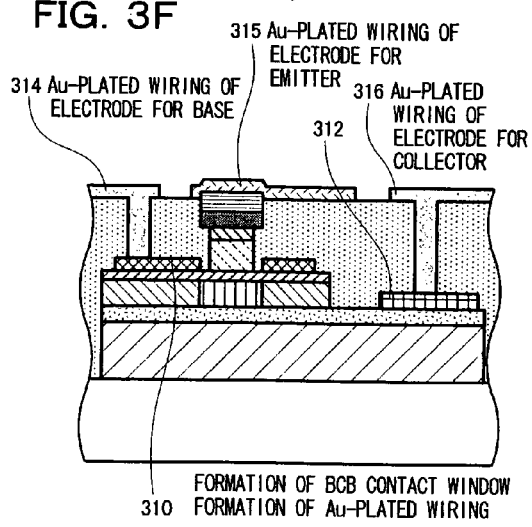

MOCVD GROWING

FORMATION OF WSi EMITTER ELECTRODE
FORMATION OF EMITTER MESA (FORMATION OF EAVE)

SELF-ALIGNMENT IMPLANTATION

FORMATION OF Pd/Pt/Au BASE ELECTRODE

FORMATION OF Ti/Al COLLECTOR ELECTRODE

NITRIDE SEMICONDUCTOR BASED BIPOLAR TRANSISTOR AND THE METHOD OF MANUFACTURE THEREOF

FIELD OF THE INVENTION

The present invention relates to a bipolar transistor using a nitride semiconductor that can be applied, for example, to a high-frequency transistor and the like used in a transmitting and receiving circuit of radio communication equipment; and to a method for manufacturing a nitride semiconductor based bipolar transistor.

BACKGROUND OF THE INVENTION

A nitride compound semiconductor represented by a GaN compound semiconductor is known as a wide-bandgap semiconductor wherein the bandgap of GaN is as large as 3.4 eV at room temperature. Since such a semiconductor has higher saturation velocity and breakdown electric field than that of the other semiconductors, such as GaAs, and Si semiconductors. The nitride compound semiconductor is expected for high-frequency and high-power electronic devices. It is one of features of a GaN based semiconductor that internal field is formed by spontaneous polarization and piezo polarization in a direction perpendicular to the formed (0001) face, and in an AlGaN/GaN hetero structure, a sheet carrier concentration of at least $1 \times 10^{13}$ cm$^{-2}$ is obtained in an undoped state. A hetero junction field effect transistor (HFET) utilizing these features has been fabricated using two-dimensional electron gas in the hetero interface, and the excellent high-frequency operation thereof has been reported. As described above, GaN based transistors heretofore reported are mainly planar field effect transistors. To realize further high-speed operation, a vertical bipolar transistor that can shorten carrier transit time is more promising than a planar transistor. In existing GaN planar field effect transistors, negative bias must be supplied to the gate electrode and positive bias must be supplied to the drain electrode, for which both positive and negative voltage power sources are required. Therefore, the downsizing of, for example, radio communication systems is difficult; however, since a bipolar transistor requires only a positive voltage power source, the downsizing of the systems becomes feasible. Heretofore, there has been reported that high-gain and high-frequency characteristics of a conventional compound semiconductor represented by GaAs can be improved by a hetero junction bipolar transistor (HBT) wherein the hetero junction is formed between the base and the emitter. In also GaN based semiconductors, it is considered that further high-speed transistors can be realized by forming HBTs in the same manner as in conventional compound semiconductors.

An example of heretofore reported GaN based HBT structures will be described below. An AlN buffer layer, an n-type GaN sub-collector layer, an n-type GaN collector layer, an n-type InGaN layer having an In component gradient layer, an Mg-doped p-type InGaN base layer, and an n-type GaN emitter layer are formed in this order on an SiC substrate. A step is formed in the n-type emitter layer, an Al/Au electrode to be an emitter electrode is formed thereon, a Pd/Au electrode to be a base electrode is formed on the exposed p-type InGaN base layer, and an Al/Au electrode to be a collector electrode is formed so as to contact the n-type GaN sub-collector layer. The feature of the GaN based HBT structure is that the activation of the dopant Mg is improved, and the base resistance which is an important factor to determine high-frequency characteristics is lowered by the InGaN base layer, in place of GaN. In the present situation, a current amplification of 20, which is one of the largest in GaN based HBT, can be realized.

DISCLOSURE OF THE INVENTION

However, by the HBT whose example of the structure is shown above, despite the fact that the Mg doping concentration in the base layer is as high as $2 \times 10^{19}$ cm$^{-3}$, the hole concentration is $5 \times 10^{18}$ cm$^{-3}$, the activation of Mg is low, and a sufficiently low base resistance has not yet been achieved. In GaN based wide-gap materials, since the activation energy of a p-type dopant represented by Mg, for example, Mg in GaN is as large as 160 meV, it is difficult to achieve a sufficiently high carrier concentration. Therefore, it is only conceivable method for further reducing the base resistance to minimize the distance between the emitter and the edge of the base electrode. However, by the HBT whose example of the structure is shown above, since the above-described step and base electrode were formed using two photolithographic processes, the distance had to be at least of aligning accuracy of the exposure equipment, and for example, when an i-line stepper was used, it was difficult that the distance was made to be not more than 0.2 µm. Furthermore, to decrease the distance, expensive state-of-the-art exposure equipment must be used, causing a problem of high manufacturing costs. Therefore, the reduction of the distance between the emitter and the edge of the base electrode had limitation, and the lowering of the base resistance was difficult. As a result, it was difficult to fabricate a GaN based HBT having excellent high-frequency characteristics.

To solve the above-described technical problems, it is an object of the present invention to provide a nitride semiconductor based bipolar transistor that can sufficiently minimize the distance between the emitter and the edge of the base electrode, and having a low base resistance and excellent high-frequency characteristics, as well as a method for manufacturing such a nitride semiconductor based bipolar transistor.

In order to achieve the above-described object, the nitride semiconductor based bipolar transistor of the present invention has a configuration wherein one of an emitter electrode and a collector electrode in a shape forming an eave on one of a part of an emitter layer and a part of a collector layer is formed, and a base electrode is formed on a base layer using the eave as a mask.

By such a configuration, the distance between the emitter and the edge of the base electrode can be shortened, the base resistance can be lowered, and the nitride semiconductor based bipolar transistor wherein high-speed operation is feasible can be realized.

The nitride semiconductor based bipolar transistor of the present invention has also the configuration wherein an InAlGaN is formed so as to be in contact with one of the emitter electrode and the collector electrode having the eave.

By such a configuration, since the barrier height of the metal electrode is small on InAlGaN, an ohmic contact resistor having a low resistance can be realized, and the serial resistance can be lowered. Further, since the distance between the emitter and the edge of the base electrode can be shortened, the base resistance can be lowered. As a result, both the serial resistance and the base resistance can be lowered, and the nitride semiconductor based bipolar transistor wherein high-speed operation is feasible can be realized.

The nitride semiconductor based bipolar transistor of the present invention has also the configuration wherein an electrode material film identical to the base electrode is formed so as to be in contact with the upper part of one of the emitter electrode and the collector electrode.

By such a configuration, the base electrode can be formed by a self-aligned process using one of the emitter electrode and the collector electrode as a mask, the distance between the emitter and the edge of the base electrode can be shortened, the base resistance can be lowered, and the nitride semiconductor based bipolar transistor wherein high-speed operation is feasible can be realized.

The nitride semiconductor based bipolar transistor of the present invention has also the configuration wherein a hetero junction is present in one of between the base and the emitter and between the base and the collector of the nitride semiconductor based bipolar transistor, or in the both.

By such a configuration, even if the hole concentration in the base layer is raised for lowering the base resistance, recombination current from the base to the emitter can be suppressed by hetero junction, the base resistance can be lowered without lowering the current amplification factor, and the nitride semiconductor based bipolar transistor having favorable high-frequency characteristics can be realized.

The nitride semiconductor based bipolar transistor of the present invention has also the configuration wherein the hetero junction is formed of one of AlGaN/GaN, InGaN/GaN and AlGaN/InGaN, and the forbidden band width of the emitter is larger than the forbidden band width of the base.

By such a configuration, the nitride semiconductor based bipolar transistor having favorable high-frequency characteristics can be realized.

The nitride semiconductor based bipolar transistor of the present invention has also the configuration wherein a benzocyclobutene film (hereafter abbreviated as "BCB film") is formed on the side of one of the emitter layer and the collector layer, and one of a part of the emitter electrode and a part of the collector electrode is exposed from the BCB film.

By such a configuration, since the transistor can be buried by the BCB film, which is a low-permittivity film having a relative permittivity of as low as 2.65, the parasitic capacitance can be lowered, and the nitride semiconductor based bipolar transistor having favorable high-frequency characteristics can be realized.

The nitride semiconductor based bipolar transistor of the present invention has also the configuration wherein a part of the base layer is composed of one of InGaNAs and InGaNP.

By such a configuration, since InGaNAs and InGaNP have smaller band gaps than InGaN conventionally used for a p-type base layer, and the activation energy of the p-type acceptor when Mg is doped is smaller, the hole concentration in the base layer can be elevated. As a result, the base resistance can be lowered, and the nitride semiconductor based bipolar transistor having favorable high-frequency characteristics can be realized.

The nitride semiconductor based bipolar transistor of the present invention has also the configuration wherein the InGaNAs and InGaNP are formed by one of ion implantation and diffusion of As and P, respectively to InGaN.

By such a configuration, one of the InGaNAs layer and the InGaNP layer can be selectively and easily formed by a self-aligned process using one of the emitter electrode and the collector electrode as a mask. As a result, the base resistance can be lowered, and the nitride semiconductor based bipolar transistor having favorable high-frequency characteristics can be realized as the transistor according to claim 8.

The nitride semiconductor based bipolar transistor of the present invention has also the configuration wherein one of the emitter electrode and the collector electrode having the eave is composed of WSi.

By such a configuration, since WSi forms an ohmic contact having a low resistance on an InAlGaN, and excels in heat resistance at the same time, a process containing a heat treatment step becomes feasible, and while containing such a heat treatment step and elevating the degree of freedom of the process, the nitride semiconductor based bipolar transistor having lower base resistance and serial resistance, wherein high-speed operation is feasible can be realized.

The nitride semiconductor based bipolar transistor of the present invention has also the configuration wherein the peripheral portion of one of the emitter electrode and the collector electrode contacting the base electrode is composed of only a line segment of crystals of the emitter layer and the collector layer in one of the <11-20> direction and the <1-100> direction.

By such a configuration, etching to the bottom of one of the emitter electrode and the collector electrode required for forming the eave is not affected by anisotropy, and when the base electrode is formed by a self-aligned process, the one of the emitter electrode and the collector electrode is not electrically connected to the base electrode, and the nitride semiconductor based bipolar transistor having a small leakage current between electrodes can be realized in high reproducibility.

The nitride semiconductor based bipolar transistor of the present invention has also the configuration wherein the major surface of one of the emitter layer, the collector layer and the base layer is formed on one of the (0001) plane having a III-group face composed only of III-group atoms and the (000-1) plane having a nitrogen face composed only of nitrogen atoms.

By such a configuration, since a transistor structure that excels in crystallinity can be formed, the nitride semiconductor based bipolar transistor of higher gain can be realized.

The nitride semiconductor based bipolar transistor of the present invention has also the configuration wherein a substrate on which the nitride semiconductor based bipolar transistor is formed is composed of one of sapphire, GaN and SiC.

By such a configuration, since a nitride semiconductor layer that excels in crystallinity can be formed on these substrates, the nitride semiconductor based bipolar transistor of higher gain can be realized.

The nitride semiconductor based bipolar transistor of the present invention has also the configuration wherein the major surface of one of the emitter layer, the collector layer and the base layer is formed on a non-polar surface where the number of nitrogen atoms is identical to the number of III-group metal atoms.

By such a configuration, since no electrical field is formed by polarization in the direction of the current flow, there is no electrical field working in the direction to disturb the acceleration of electrons in the base layer, and as a result, the nitride semiconductor based bipolar transistor wherein high-speed operation is feasible can be realized.

The nitride semiconductor based bipolar transistor of the present invention has also the configuration formed on a conductive substrate, and wherein one of a collector electrode and an emitter electrode is formed on the back face of the conductive substrate.

By such a configuration, since neither collector electrode nor emitter electrode is formed on the surface side of the substrate, the nitride semiconductor based bipolar transistor having a smaller chip area can be realized.

Furthermore, a method for manufacturing a nitride semiconductor based bipolar transistor of the present invention has a configuration comprising a step for forming a collector layer, a base layer, an emitter layer and a nitride semiconductor layer composed of a nitride semiconductor on a substrate in this order; a step for selectively forming an emitter electrode on the nitride semiconductor layer; a step for simultaneously and selectively removing the nitride semiconductor layer and the emitter layer using the emitter electrode as a mask to expose the base layer and to form an eave underneath the emitter electrode; and a step for forming a base electrode contacting the base layer using the emitter electrode as a mask.

By such a configuration, the base electrode can be formed by a process for self-aligning with the emitter electrode, and the nitride semiconductor based bipolar transistor wherein the chip area is smaller, the base resistance can be lowered by shortening the distance between the emitter and the edge of the base electrode, and high-speed operation is feasible, can be realized.

In addition, a method for manufacturing a nitride semiconductor based bipolar transistor has a configuration comprising a step for forming an emitter layer, a base layer, a collector layer and a nitride semiconductor layer composed of a nitride semiconductor on a substrate in this order; a step for selectively forming a collector electrode on the nitride semiconductor layer; a step for simultaneously and selectively removing the nitride semiconductor layer and the collector layer using the collector electrode as a mask to expose the base layer and to form an eave underneath the collector electrode; and a step for forming a base electrode contacting the base layer using the collector electrode as a mask.

By such a configuration, the base electrode can be formed by a process for self-aligning with the collector electrode, and the nitride semiconductor based bipolar transistor wherein the chip area is smaller, the base resistance can be lowered by shortening the distance between the step of the collector and the edge of the base electrode, and high-speed operation is feasible, can be realized.

As described above, there can be provided a nitride semiconductor based bipolar transistor that can sufficiently minimize the distance between the emitter and the edge of the base electrode, and having a low base resistance and excellent high-frequency characteristics, as well as a method for manufacturing such a nitride semiconductor based bipolar transistor.

BRIEF DESCRIPTION OF THE DRAWINGS

FIG. 3A is a process sectional view illustrating a method for manufacturing a hetero junction bipolar transistor according to the first embodiment of the present invention;

FIG. 3B is another process sectional view illustrating a method for manufacturing a hetero junction bipolar transistor according to the first embodiment of the present invention;

FIG. 3C is another process sectional view illustrating a method for manufacturing a hetero junction bipolar transistor according to the first embodiment of the present invention;

FIG. 3D is another process sectional view illustrating a method for manufacturing a hetero junction bipolar transistor according to the first embodiment of the present invention;

FIG. 3E is another process sectional view illustrating a method for manufacturing a hetero junction bipolar transistor according to the first embodiment of the present invention;

FIG. 3F is another process sectional view illustrating a method for manufacturing a hetero junction bipolar transistor according to the first embodiment of the present invention;

DESCRIPTION OF THE EMBODIMENTS

Figure 1:
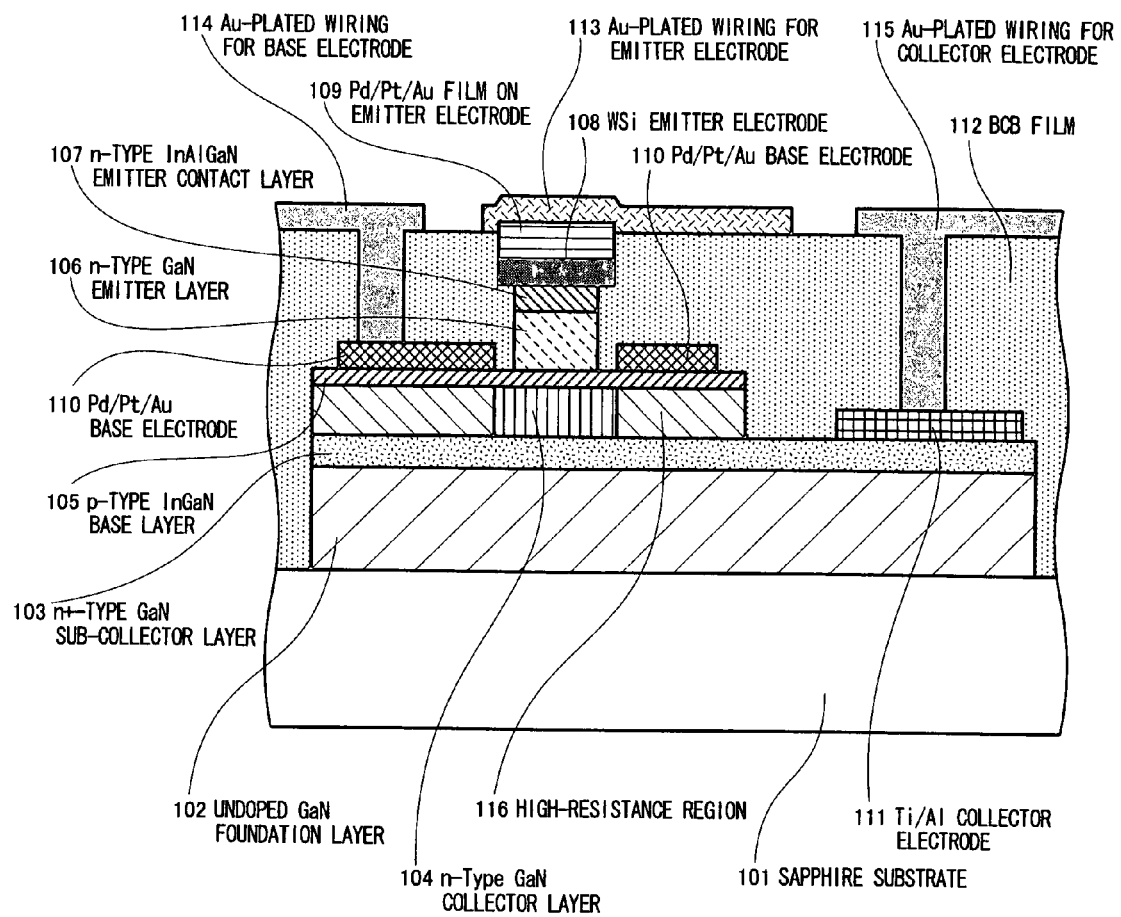
FIG. 1 is a sectional view illustrating the structure of a hetero junction bipolar transistor according to a first embodiment of the present invention.

The embodiments of the present invention will be described below referring to the drawings.

First Embodiment

Firstly, the first embodiment will be described referring to FIGS. 1, 2 and 3.

FIG. 1 is a sectional view illustrating the structure of a nitride hetero junction bipolar transistor according to the first embodiment of the present invention; FIG. 2 is a configurational view illustrating a mask pattern of a hetero junction bipolar transistor according to the first embodiment of the present invention; and FIG. 3 is process sectional views illustrating a method for manufacturing a hetero junction bipolar transistor according to the first embodiment of the present invention.

In FIG. 1, reference numeral 101 denotes a sapphire substrate, 102 denotes an undoped GaN foundation layer, 103 denotes an n+-type GaN sub-collector layer, 104 denotes an n-type GaN collector layer, 105 denotes a p-type InGaN base layer, 106 denotes an n-type GaN emitter layer, 107 denotes an n-type InAlGaN emitter contact layer, 108 denotes a WSi emitter electrode, 109 denotes a Pd/Pt/Au film on the emitter electrode, 110 denotes a Pd/Pt/Au base electrode, 111 denotes a Ti/Al collector electrode, 112 denotes a BCB (benzocyclobutene) film, 113 denotes an Au-plated wiring for the emitter electrode, 114 denotes an Au-plated wiring for the base electrode, 115 denotes an Au-plated wiring for the collector electrode, and 116 denotes a high-resistance region.

As FIG. 1 shows, a nitride semiconductor based hetero junction bipolar transistor having a Pd/Pt/Au base electrode 110 formed by a self-alignment process so as to have a WSi emitter electrode 108 on an n-type InAlGaN emitter contact layer 107 and to contact a p-type InGaN base layer 105, is formed.

Here, on the (0001) plane of a sapphire substrate 101, 2 μm of an undoped GaN foundation layer 102, 1 μm of an n+-type GaN sub-collector layer 103, 500 nm of an n-type GaN collector layer 104, 100 nm of a p-type InGaN base layer 105, 200 nm of an n-type GaN emitter layer 106, and 20 nm of an n-type InAlGaN emitter contact layer 107 are formed in the above-described order. Parts of the n-type GaN emitter layer 106 and the n-type InAlGaN emitter contact layer 107 are selectively removed by a depth of, for example, about 220 nm. Furthermore, an ohmic electrode composed of WSi is formed as an emitter electrode so as to contact the n-type InAlGaN emitter contact layer 107. Since the barrier height with the metal is small in the junction between InAlGaN and the metal, for example, even the contact resistance of WSi without heat treatment is suppressed to about $1 \times 10^{-5}$ $\Omega\text{cm}^2$. This is considered because the electron affinity of WSi on InAlGaN is larger compared with, for example, GaN. To lower the contact resistance, the larger Si doping quantity of the n-type InAlGaN emitter contact layer 107, for example, at least $1 \times 10^{19}$ $\text{cm}^{-3}$ of doping is preferable. The n-type InAlGaN emitter contact layer 107 is composed of, for example, $\text{In}_{0.09}\text{Al}_{0.39}\text{Ga}_{0.6}\text{N}$, and is formed so as to be lattice-matched to GaN within a component range feasible to excel in crystallinity and to form a thick film. In the HBT on the (0001) plane shown in FIG. 1, an electric field originated from polarization is produced in the direction to inhibit the acceleration of electrons in the p-type InGaN base layer 105, and the HBT is disadvantageous for improving the operation speed. On the other hand, when a GaN based semiconductor having a so-called nonpolar a-face ((11-20) plate) is formed on, for example, a sapphire R-face ((1-102) plane), the electric field originated from polarization is not formed perpendicularly to the hetero interface; therefore, electrons can move without the effect of the electric field originated from polarization. In the nitride semiconductor based bipolar transistor of the first embodiment, since the above-described internal field is not produced in the p-type InGaN base layer 105, the transistor is advantageous for high-speed operation.

The WSi emitter electrode 108 contacts the n-type InAlGaN emitter contact layer 107 so as to form an eave, and a Pd/Pt/Au base electrode 110 is formed by a so-called self-aligned process on the p-type InGaN base layer 105 using the WSi emitter electrode 108 as a mask so as not to contact the n-type GaN emitter layer 106. For example, the n-type GaN emitter layer 106 and the n-type InAlGaN emitter contact layer 107 shown in FIG. 1 are formed so as to have a width of 2 μm, and the WSi emitter electrode 108 is formed so as to have a width of 2.2 μm. By such a structure the electrical connection of the base electrode with the emitter region can be prevented; the base electrode can be formed in high yield by a self-aligned process; the distance between emitter and base electrodes of 0.1 μm, shorter than 0.2 μm which is the limit of conventional mask alignment, can be realized; and the base resistance can be lowered. To lower the contact resistance of the base electrode, a material for the base electrode having a high work function is desirable. For example, in a Pd based material shown in FIG. 1, the contact resistance of the base can be lowered and favorable high-frequency characteristics can be realized by using a transparent oxide conductor film having a work function of about 6 eV, such as ZnInSnO (ZITO) and GaInSn (GITO) for the base electrode. In regions other than the region under the emitter electrode 108 in the n-type GaN collector layer, a high-resistance region is formed by a so-called self-aligned process using the WSi emitter electrode 108 as a mask by implanting ions of B, O or the like. By such a configuration, the capacitance between the base and the collector can be lowered, and favorable high-frequency characteristics can be realized. In addition, since a self-aligned process is used, the step for forming a mask used for selective ion implantation can be eliminated, and a low-cost process can be realized.

Furthermore, the p-type InGaN base layer 105 and the n-type GaN collector layer 104 are selectively removed, and a Ti/Al collector electrode 111 is formed so as to contact the exposed n+-type GaN sub-collector layer 103. In addition, the n+-type GaN sub-collector layer 103 and the undoped GaN foundation layer 102 in the regions other than the device region are selectively removed. By such a structure, a plurality of HBTs formed on the same substrate can be isolated and integrated. A BCB film 112, which is a low-permittivity film having a relative permittivity of as low as 2.65 is formed so as to cover the uppermost surface of the emitter electrode, and an Au-plated wiring 113 for the emitter electrode is formed on the BCB film 112 so as to contact the exposed emitter electrode. A contact hole for the base electrode and a contact hole for the collector electrode are formed in the BCB film 112, and an Au-plated wiring 114 for the base electrode and an Au-plated wiring 115 for the collector electrode are formed via the two contact holes so as to be connected to the collector electrode and the base electrode, respectively. Although an example of a so-called double hetero junction bipolar transistor of GaN/InGaN/GaN was described here, the transistor can be an AlGaN/GaN hetero junction bipolar transistor, or can be a double hetero junction bipolar transistor of AlGaN/GaN/AlGaN or AlGaN/InGaN/AlGaN. Although an insulating sapphire substrate was used and the collector electrode is drawn out of the surface of the substrate here, the substrate can also be one of an SiC substrate, a GaN substrate and an Si substrate. When a conductive n-type GaN substrate is used, an n+-type GaN sub-collector layer 103 can be directly formed on the substrate, and a Ti/Al collector electrode 111 can be formed on the back face of the substrate. Although an example wherein WSi is used for the emitter electrode was described here, one of tungsten and palladium can also be used. According to the hetero junction bipolar transistor described in this embodiment, by forming the base electrode using a self-aligned process, a transistor having a lowered base resistance and favorable high-frequency characteristics can be realized.

Figure 2:
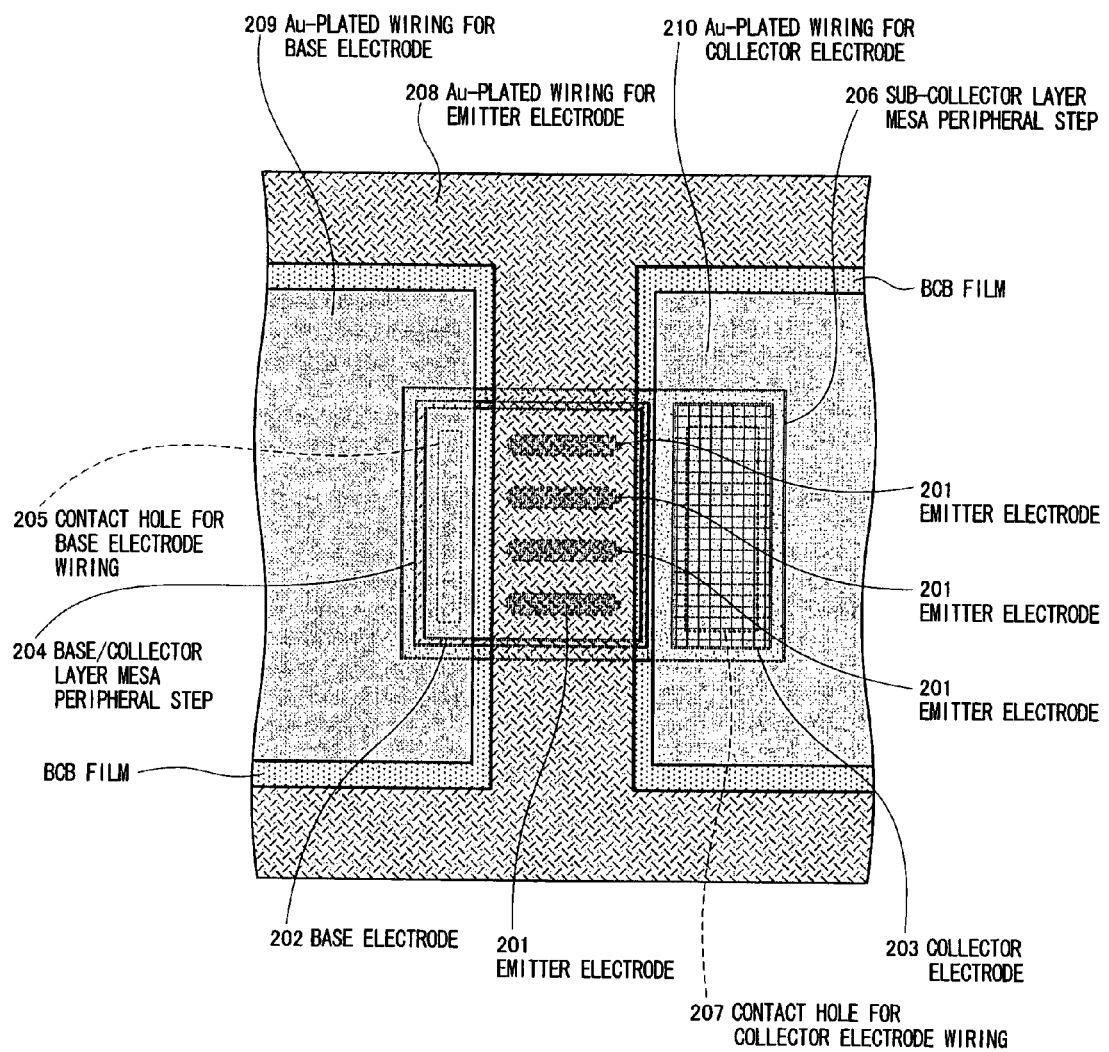
FIG. 2 is a configurational view illustrating a mask pattern of a hetero junction bipolar transistor according to the first embodiment of the present invention.

FIG. 2 is a configuration diagram illustrating an example of layouts on a mask when a hetero junction bipolar transistor whose cross-sectional structure is shown in FIG. 1 is applied to a high-frequency transistor.

In FIG. 2, reference numeral 201 denotes an emitter electrode, 202 denotes a base electrode, 203 denotes a collector electrode, 204 denotes a base/collector layer mesa peripheral step, 205 denotes a contact hole for base electrode wiring, 206 denotes a sub-collector layer mesa peripheral step, 207 denotes a contact hole for collector electrode wiring, 208 denotes an Au-plated wiring for emitter electrode, 209 denotes an Au-plated wiring for base electrode, and 210 denotes an Au-plated wiring for collector electrode. Here, an n-type InAlGaN emitter contact layer and an n-type GaN emitter layer are selectively formed under an emitter electrode 201 in a side-etched manner, and to eliminate the effect of the anisotropy of etching, the emitter electrode 201 has a hexagonal shape formed of parallel sides in one of the <11-20> direction and the <1-100> direction. By arranging the sides hexagonally, the effect of the anisotropy of etching can be eliminated. The emitter electrode 201 has a plurality of fingers for enlarging current, which are connected to each other by the emitter Au-plated wiring 208. Since the emitter electrode 201 has a plurality of fingers in the hetero junction bipolar transistor having the above-described configuration, a high-frequency transistor with higher output wherein high-speed operation is feasible can realized in a small chip area.

To fabricate a hetero junction bipolar transistor whose sectional view is shown in FIG. 1 and whose mask pattern layout is shown in FIG. 2, for example, a manufacturing method shown in FIG. 3 can be considered. FIG. 3 is a configuration diagram illustrating a method for manufacturing a hetero junction bipolar transistor according to the first embodiment of the present invention.

In FIG. 3, reference numeral 301 denotes a sapphire substrate, 302 denotes an undoped GaN foundation layer, 303 denotes an n+-type GaN sub-collector layer, 304 denotes an n-type GaN collector layer, 305 denotes a p-type InGaN base layer, 306 denotes an n-type GaN emitter layer, 307 denotes an n-type InAlGaN emitter contact layer, 308 denotes a WSi emitter electrode, 309 denotes a high-resistance region, 310 denotes a Pd/Pt/Au base electrode, 311 denotes a Pd/Pt/Au film on emitter electrode, 312 denotes a Ti/Al collector electrode, 313 denotes a BCB film, 314 denotes an Au-plated wiring of electrode for base, 315 denotes an Au-plated wiring of electrode for emitter, and 316 denotes an Au-plated wiring of electrode for collector.

First, 2 μm of an undoped GaN foundation layer 302, 1 μm of an n-type GaN sub-collector layer 303, 0.5 μm of an n-type GaN collector layer 304, 100 nm of a p-type InGaN base layer 305, 200 nm of an n-type GaN emitter layer 306, and 20 nm of an n-type InAlGaN emitter contact layer 307 are formed in this order on a sapphire (0001) substrate 301 by a metal organic chemical vapor deposition (MOCVD) method (FIG. 3A).

After the epitaxial growth, the WSi emitter electrode 308 is formed on the entire surface by, for example, an RF sputtering method, and is selectively removed by, for example, reactive ion etching (RIE) using $CF_4$ gas to form an island pattern. Further, using the WSi emitter electrode 308 as a mask, the n-type InAlGaN emitter contact layer 307 and the n-type GaN emitter layer 306 are etched off by about 220 nm by inductive coupled plasma (ICP) dry etching using a gas such as $Cl_2$ gas to expose the p-type InGaN base layer 305. At this time, the peripheral portions of the n-type InAlGaN emitter contact layer 307 and the n-type GaN emitter layer 306 under the WSi emitter electrode 308 are over-etched in such a way that the WSi emitter electrode 308 is a dome (FIG. 3B). The island-shaped WSi emitter electrode 308 is preferably hexagonal with sides in one of the <1-100> direction and the <11-20> direction because the isotropic eave is formed. A plurality of circular or hexagonal islands can also be formed. Further, using the WSi emitter electrode 308 as a mask, a high-resistance region 309 is formed in the n-type GaN collector layer 304 by, for example, implanting ions of one of B and O.

Next, a Pd/Pt/Au film on emitter electrode 311 is formed on the WSi emitter electrode 308, and a Pd/Pt/Au base electrode 310 is formed on the p-type InGaN base layer 305 that has been exposed by etching (FIG. 3C).

Then, to expose the n+-type GaN sub-collector layer 303, a part of the n-type GaN collector layer 304 is selectively removed by, for example, ICP. After exposing the n+-type GaN sub-collector layer 303, one of the sapphire substrate 301 and the undoped GaN foundation layer 302 between adjoining elements is selectively removed by, for example, ICP (not shown). By thus removing the foundation layer, a plurality of HBTs can be electrically isolated. Although an example wherein the n+-type GaN sub-collector layer 303 was removed was described here, elements can also be isolated by selectively implanting ions of one of B and O on the periphery of the device to elevate resistance. Further, a Ti/Al collector electrode 312 is formed on the surface of the exposed n+-type GaN sub-collector layer 303 (FIG. 3D) Next, a BCB film 313 is applied, and by, for example, reactive ion etching (RIE) using $CF_4$ gas, a part of the surface of the BCB film 301 is etched off, to expose only the Pd/Pt/Au film on emitter electrode 311, or the Pd/Pt/Au film on the emitter electrode 311 on the WSi emitter electrode 308, and the WSi emitter electrode 308. This is called "head exposure" (FIG. 3E).

Next, openings are formed on part of the Pd/Pt/Au base electrode 310 and the Ti/Al collector electrode 312 in the BCB film 313 by, for example, RIE. Via these openings, an Au-plated wiring of electrode for base 314 and an Au-plated wiring of electrode for collector 316 are formed so as to contact the Pd/Pt/Au base electrode 310 and the Ti/Al collector electrode 312, respectively (FIG. 3F).

According to the method for manufacturing a hetero junction bipolar transistor described in the first embodiment, since the Pd/Pt/Au base electrode is formed by a self-aligned process using the WSi emitter electrode 318 as a mask, the distance between the emitter and the edge of the base electrode can be shortened to lower the base resistance, and an HBT that can operate at high-speed can be realized. In addition, since the parasitic capacitance including the capacitance between the base and the collector can be lowered, an HBT having favorable high-frequency characteristics can be realized.

Although WSi was used for the emitter electrode in the above-described embodiment, W, which can be formed in the above-described method can also be used for the emitter electrode. In the HBT shown in FIG. 1, a collector-up structure wherein the emitter electrode and the collector electrode are interchanged can also be adopted. In this case, if the collector-up structure is formed on one of the (0001) plane and the (000-1) plane, electrons are accelerated in the base layer, which is advantageous for high-speed operation.

The collector-up structure can be fabricated as described below. Specifically, in the steps shown in FIG. 3, an emitter layer composed of a nitride semiconductor, a base layer, a collector layer, and a nitride semiconductor layer are formed in this order on a substrate, and a collector electrode is selectively formed on the nitride semiconductor layer. The nitride semiconductor layer and the collector layer are selectively removed at the same time using the collector electrode as a mask to expose the base layer and form an eave underneath the collector electrode, and a base electrode is formed so as to contact the base layer using the collector electrode as a mask. Thus, the collector-up structure can be fabricated.

Second Embodiment

Next, a nitride semiconductor based bipolar transistor according to the second embodiment will be described referring to FIGS. 4 and 5.

Figure 4:
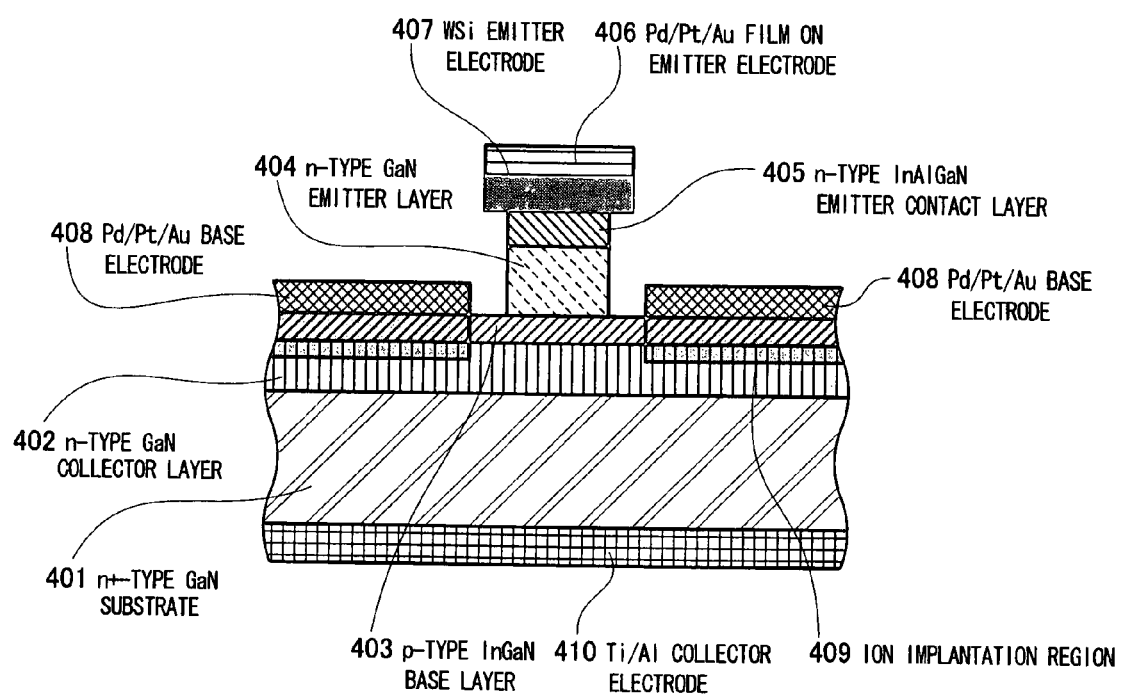
FIG. 4 is a sectional view illustrating the structure of a hetero junction bipolar transistor according to a second embodiment of the present invention.

FIG. 4 is a sectional view illustrating the structure of a hetero junction bipolar transistor according to the second embodiment of the present invention; and FIG. 5 is a process sectional view illustrating a method for manufacturing a hetero junction bipolar transistor according to the second embodiment of the present invention.

In FIG. 4, reference numeral 401 denotes an n+-type GaN substrate, 402 denotes an n-type GaN collector layer, 403 denotes a p-type InGaN base layer, 404 denotes an n-type GaN emitter layer, 405 denotes an n-type InAlGaN emitter contact layer, 406 denotes a Pd/Pt/Au film on emitter electrode, 407 denotes a WSi emitter electrode, 408 denotes a Pd/Pt/Au base electrode, 409 denotes an ion implantation region, and 410 denotes a Ti/Al collector electrode.

FIG. 4 shows the structure of a GaN based hetero junction bipolar transistor wherein a WSi emitter electrode 407 is formed on an n-type InAlGaN emitter contact layer 405, and a Pd/Pt/Au base electrode 408 is formed so as to contact a p-type InGaN base layer 403 and so as not to be electrically connected to an n-type GaN emitter layer 404 by a self-aligned process using the WSi emitter electrode 407 as a mask. Here, 0.5 μm of an n-type GaN collector layer 402, 0.1 μm of a p-type InGaN base layer 403, 0.3 μm of an n-type GaN emitter layer 404, and 20 nm of the n-type InAlGaN emitter contact layer 405 are formed in this order on an n+-type GaN (0001) substrate 401. Parts of the n-type GaN emitter layer 404 and the n-type InAlGaN emitter contact layer 405 are selectively removed so that the p-type InGaN base layer 403 is exposed in a depth of, for example, about 320 nm.

A WSi ohmic electrode is formed as a WSi emitter electrode 407 so as to contact the n-type InAlGaN emitter contact layer 405.

Since the InAlGaN layers have small barrier heights in the same manner as in the first embodiment, for example, even if the WSi emitter electrode 407 is not subjected to heat treatment, the contact resistance can be suppressed to about $1 \times 10^{-5} \Omega cm^2$.

The InAlGaN layers are composed, for example, of $In_{0.09}Al_{0.39}Ga_{0.6}N$, and are formed so as to match the lattice of GaN, within a composition range where crystallinity is favorable and thick-film forming is feasible. The WSi emitter electrode 407 contacts the n-type InAlGaN emitter contact layer 405 so as to form an eave, and a Pd/Pt/Au base electrode 408 is formed by so-called a self-aligned process so as to contact the p-type InGaN base layer 403 and so as not to contact the n-type GaN emitter layer 404 using the WSi emitter electrode 407 as a mask. Furthermore, ions of for example, As or P are implanted in only the p-type InGaN base layer 403, or the p-type InGaN base layer 403 and a part of the n-type GaN collector layer 402 under the base electrode, by a so-called self-aligned process using the WSi emitter electrode 407 as a mask. By such implantation, the composition of the p-type InGaN base layer 403 is changed to one of p-type InGaNAs and p-type InGaNP.

InGaNAs and InGaNP have smaller band gaps than InGaN, and when Mg is doped in InGaNAs and InGaNP to turn them into p-type, the activation energy is lowered with the lowering of the band gaps. Therefore, since a higher hole concentration can be realized than conventional InGaN, the base resistance can further be lowered, and the frequency characteristics can be improved. A Ti/Al collector electrode 410 is formed on the back face of the n+-type GaN substrate 401. Here, the width of the n-type GaN emitter layer 404 shown in FIG. 4 is about 2.0 μm, and the width of the WSi emitter electrode 407 is about 2.2 μm. By forming the Pd/Pt/Au base electrode 408 by a self-aligned process using the eave formed in the WSi emitter electrode 407 as a mask, the distance between the emitter electrode and the base electrode can be shortened to 0.1 μm, and the base resistance can be lowered. Therefore, in the second embodiment, by mixing one of P and As in InGaN in the base region to shorten the band gap and lower the activation energy of a p-type impurity, the resistance can be lowered, and an HBT with low base resistance and excellent high-frequency characteristics can be realized.

To fabricate the hetero junction bipolar transistor shown in FIG. 4, for example, a method shown in FIG. 5 can be considered. FIG. 5 is a configuration diagram illustrating a method for manufacturing a hetero junction bipolar transistor according to the second embodiment of the present invention.

In FIG. 5, reference numeral 501 denotes an n+-type GaN substrate, 502 denotes an n-type GaN collector layer, 503 denotes a p-type InGaN base layer, 504 denotes an n-type GaN emitter layer, 505 denotes an n-type InAlGaN emitter contact layer, 506 denotes a WSi emitter electrode, 507 denotes an ion implantation region, 508 denotes a Pd/Pt/Au base electrode, and 509 denotes a Ti/Al collector electrode.

Figure 5A:
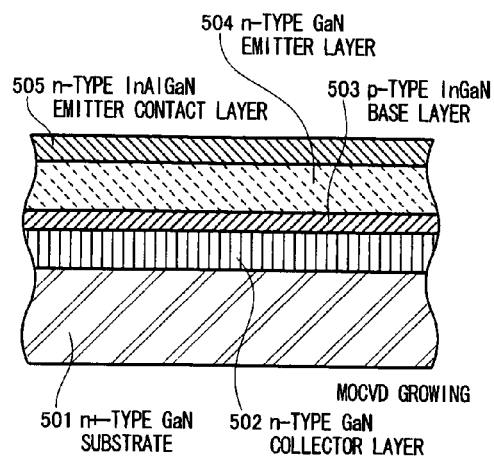
FIG. 5A is a process sectional view illustrating a method for manufacturing a hetero junction bipolar transistor according to the second embodiment of the present invention.

First, 500 nm of an n-type GaN collector layer 502, 100 nm of a p-type InGaN base layer 503, 300 nm of an n-type GaN emitter layer 504, and 20 nm of an n-type InAlGaN emitter contact layer 505 are formed in this order on an n+-type GaN (0001) substrate 501 by a metal organic chemical vapor deposition (MOCVD) method (FIG. 5A).

Figure 5B:
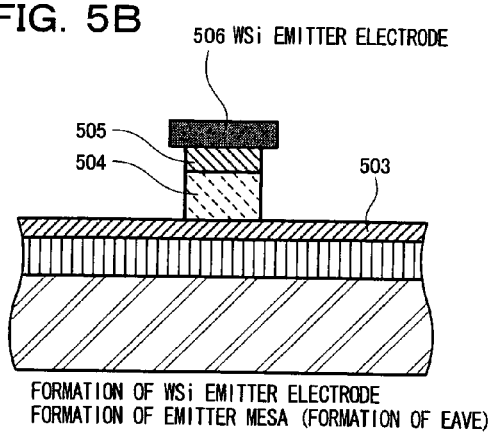
FIG. 5B is another process sectional view illustrating a method for manufacturing a hetero junction bipolar transistor according to the second embodiment of the present invention.

Next, after the above-described epitaxial growth, a WSi emitter electrode 506 is formed. The n-type InAlGaN emitter contact layer 505 and the n-type GaN emitter layer 504 are etched on the order of 300 nm by, for example, ICP dry etching using the WSi emitter electrode 506 as a mask to expose the p-type InGaN base layer 503. At this time, the n-type InAlGaN emitter contact layer 505 and the n-type GaN emitter layer 504 are etched in the state wherein the WSi emitter electrode 506 becomes an eave (FIG. 5B).

Figure 5C:
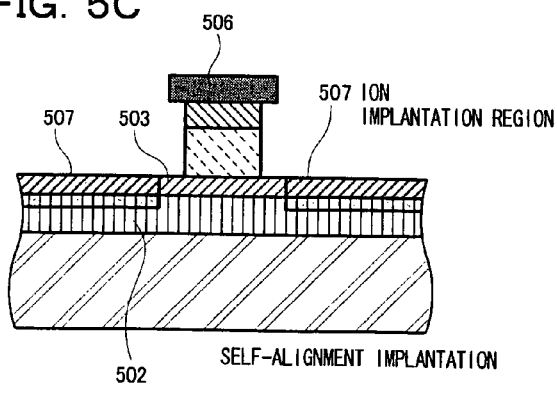
FIG. 5C is another process sectional view illustrating a method for manufacturing a hetero junction bipolar transistor according to the second embodiment of the present invention.

Next, after the ICP dry etching, ions of one of As and P are selectively implanted in the p-type InGaN base layer 503, or the p-type InGaN base layer 503 and the n-type GaN collector layer 502 by a so-called self-aligned process using the WSi emitter electrode 506 as a mask. By implanting a V-group element, such as As and P in the p-type InGaN base layer, InGaNP and InGaNAs are formed, respectively, and by making the band gap narrow and reducing the activation energy, the hole concentration can be elevated. As a result, the base resistance and the base electrode contact resistance can be lowered (FIG. 5C).

Figure 5D:
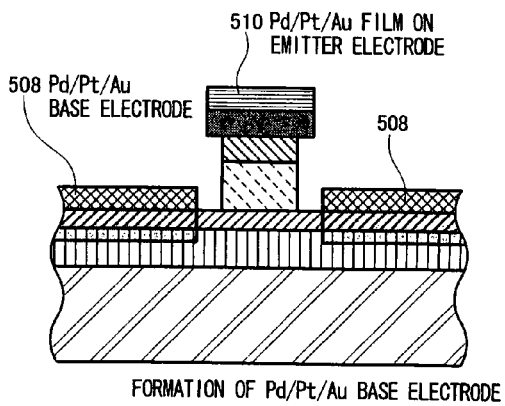
FIG. 5D is another process sectional view illustrating a method for manufacturing a hetero junction bipolar transistor according to the second embodiment of the present invention.

After the ion implantation, a Pd/Pt/Au base electrode 508 is formed by a so-called self-aligned process on the p-type InGaN base layer 503 exposed by etching using the WSi emitter electrode 506 as a mask, and a Pd/Pt/Au film on emitter electrode 510 is formed on the WSi emitter electrode 506 (FIG. 5D).

Figure 5E:
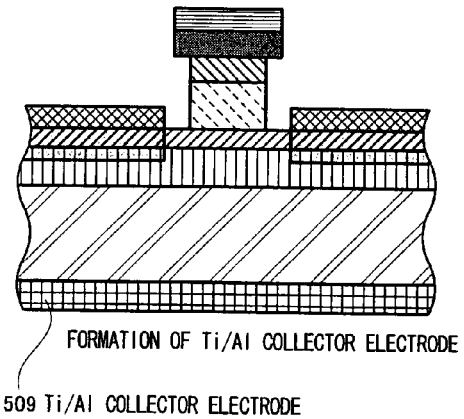
FIG. 5E is another process sectional view illustrating a method for manufacturing a hetero junction bipolar transistor according to the second embodiment of the present invention.

Finally, a Ti/Al collector electrode 509 is formed on the back face of the n+-type GaN substrate 501. Here, for example, after thinning the n+-type GaN substrate to about 150 μm, the collector electrode is formed (FIG. 5E).

According to the method for manufacturing a hetero junction bipolar transistor described in the second embodiment, by using one of InGaNP and InGaNAs in a part of the base layer to elevate the hole concentration, forming a Pd/Pt/Au base electrode using a self-aligned process, and shortening the distance between the edge of the base electrode and the emitter to lower the base resistance, a hetero junction bipolar transistor having further excellent high-frequency characteristics can be realized.

Here, the GaN substrate and the sapphire substrate used in the embodiments shown in FIGS. 1 to 3 can be of any plane orientation, for example, a plane orientation having an off angle from the representative plane, such as the (0001) plain. The substrate can be one of SiO, ZnO, Si, GaAs, GaP, InP, $LiGaO_2$, $LiAlO_2$, and a mixed crystal thereof. The epitaxial growth layer of the field effect transistor shown here can be of any composition ratio of nitride semiconductors, and can contain any multilayer structure, as long as desired transistor characteristics can be realized; and the method for growing the crystal is not limited to MOCVD, but for example, molecular beam epitaxy (MBE) and hydride vapor phase epitaxy (HVPE) can also be used. The epitaxial growth layer can contain one of a V-group element, such as and P, and a III-group element, such as B as a component element, as long as the operation of the hetero junction bipolar transistor can be realized.

Although an n+-type InAlGaN and n-type GaN are used for the emitter contact layer and the emitter layer, respectively, in the embodiment shown in FIGS. 1 to 3, the emitter contact layer can be eliminated, and n-type InAlGaN can also be used for the emitter layer. By forming such a configuration, since the energy band gap of, for example, $In_{0.09}Al_{0.39}Ga_{0.6}N$ is 3.46 eV, which is wider than 3.4 eV of GaN, and the electron affinity thereof is larger than the electron affinity of GaN, a higher barrier wall than GaN can be formed in the valence band. In addition, by using InAlGaN for the emitter layer, the recombination of holes implanted from the base into the emitter can be suppressed, and current amplification can be improved. Since InAlGaN have ohmic characteristics of low resistance, a nitride semiconductor based HBT having a low serial resistance and an improved current amplification at the same time can be formed. Furthermore, although n+-type GaN was used for the sub-collector layer, n+-type InAlGaN can also be used. By such a configuration, since n+-type InAlGaN can realize a lower contact resistance than n+-type GaN, a nitride semiconductor based HBT having a further low serial resistance can be formed.

What is claimed is:

1. A nitride semiconductor based bipolar transistor, comprising:
   a substrate;
   a base layer formed on the substrate;
   an emitter layer in contact with the base layer;
   a collector layer in contact with the base layer;
   a base electrode in contact with the base layer;
   an emitter electrode in contact with the emitter layer;
   a collector electrode in contact with the collector layer; and
   an eave formed on one of the emitter electrode and the collector electrode so that a width of one of the emitter electrode and the collector electrode having the eave formed thereon is larger than a width of one of the emitter layer and the collector layer,
   wherein an InAlGaN quaternary mixed crystal is formed in direct contact with one of the emitter electrode and the collector electrode having the eave.

2. The nitride semiconductor based bipolar transistor according to claim 1, wherein an end portion of the base electrode is located below an end portion of the eave.

3. The nitride semiconductor based bipolar transistor according to claim 1, wherein an electrode material film identical to the base electrode is formed so as to be in contact with the upper part of one of the emitter electrode and the collector electrode.

4. The nitride semiconductor based bipolar transistor according to claim 1, wherein a hetero junction is present in one of between the base and the emitter and between the base and the collector of the nitride semiconductor based bipolar transistor, or in the both.

5. The nitride semiconductor based bipolar transistor according to claim 4, wherein the hetero junction is formed of one of AlGaN/GaN, InGaN/GaN and AlGaN/InGaN, and the forbidden band width of the emitter is larger than the forbidden band width of the base.

6. The nitride semiconductor based bipolar transistor according to claim 1, wherein a benzocyclobutene film is formed on the side of one of the emitter layer and the collector layer, and one of a part of the emitter electrode and a part of the collector electrode is exposed from the benzocyclobutene film.

7. The nitride semiconductor based bipolar transistor according to claim 1, wherein a part of the base layer is composed of one of InGaNAs and InGaNP.

8. The nitride semiconductor based bipolar transistor according to claim 7 wherein the InGaNAs and InGaNP are formed by one of ion implantation and diffusion of As and P, respectively.

9. The nitride semiconductor based bipolar transistor according to claim 1, wherein one of the emitter electrode and the collector electrode having the eave is composed of one of WSi and W.

10. The nitride semiconductor based bipolar transistor according to claim 1, wherein the peripheral side of one of the emitter electrode and the collector electrode contacting the base electrode is in one of the <11-20> direction and the <1-100> direction.

11. The nitride semiconductor based bipolar transistor according to claim 1, wherein the major surface of one of the emitter layer, the collector layer and the base layer is formed on one of the (0001) plane having a III-group face composed only of III-group atoms and the (000-1) plane having a nitrogen face composed only of nitrogen atoms.

12. The nitride semiconductor based bipolar transistor according to claim 11, wherein a substrate on which the nitride semiconductor based bipolar transistor is formed is composed of one of sapphire, GaN and SiC.

13. The nitride semiconductor based bipolar transistor according to claim 1, wherein the major surface of one of the emitter layer, the collector layer and the base layer is formed on a non-polar surface where the number of nitrogen atoms is identical to the number of III-group metal atoms.

14. The nitride semiconductor based bipolar transistor according to claim 1, formed on a conductive substrate, and wherein one of the collector electrode and the emitter electrode is formed on the back face of the conductive substrate.

15. A nitride semiconductor based bipolar transistor, comprising:
   a substrate;
   a base layer formed on the substrate;
   an emitter layer in contact with the base layer;
   a collector layer in contact with the base layer;
   a base electrode in contact with the base layer;
   an emitter electrode in contact with the emitter layer;
   a collector electrode in contact with the collector layer; and
   an InAlGaN semiconductor mixed crystal in direct contact with one of the emitter electrode and the collector electrode.

* * * * *